(12) United States Patent
Kobayashi

(10) Patent No.: US 12,062,930 B2
(45) Date of Patent: Aug. 13, 2024

(54) CELL SUPERVISING CIRCUIT AND BATTERY MANAGEMENT SYSTEM

(71) Applicant: NUVOTON TECHNOLOGY CORPORATION JAPAN, Kyoto (JP)

(72) Inventor: Hitoshi Kobayashi, Osaka (JP)

(73) Assignee: NUVOTON TECHNOLOGY CORPORATION JAPAN, Kyoto (JP)

( * ) Notice: Subject to any disclaimer, the term of this patent is extended or adjusted under 35 U.S.C. 154(b) by 600 days.

(21) Appl. No.: 17/185,456

(22) Filed: Feb. 25, 2021

(65) Prior Publication Data

US 2021/0184474 A1 Jun. 17, 2021

Related U.S. Application Data

(63) Continuation of application No. PCT/JP2019/033491, filed on Aug. 27, 2019.

(30) Foreign Application Priority Data

Aug. 29, 2018 (JP) ................................. 2018-160104

(51) Int. Cl.
*H02J 7/00* (2006.01)
*G01R 31/3835* (2019.01)
*G01R 31/396* (2019.01)
*H01M 10/48* (2006.01)
*B60L 58/22* (2019.01)

(52) U.S. Cl.
CPC ........ *H02J 7/0014* (2013.01); *G01R 31/3835* (2019.01); *G01R 31/396* (2019.01); *H01M 10/48* (2013.01); *H02J 7/00032* (2020.01); *H02J 7/0048* (2020.01); *B60L 58/22* (2019.02); *H02J 7/0063* (2013.01)

(58) Field of Classification Search
USPC ......................................................... 320/136
See application file for complete search history.

(56) References Cited

U.S. PATENT DOCUMENTS

2006/0214507 A1* 9/2006 Suzuki ..................... H03H 7/40
307/3
2012/0306506 A1* 12/2012 Kiuchi ............... G01R 31/3842
324/434

(Continued)

FOREIGN PATENT DOCUMENTS

JP 2011-163847 A 8/2011
JP 2014-527680 A 10/2014

(Continued)

OTHER PUBLICATIONS

International Search Report and Written Opinion issued on Oct. 1, 2019 in International Application No. PCT/JP2019/033491; with partial English translation.

*Primary Examiner* — Samuel Berhanu
(74) *Attorney, Agent, or Firm* — Rimon P.C.

(57) ABSTRACT

A cell supervising circuit includes: a measurement circuit which measures a state of charge of a secondary battery cell; a transformer which is provided for the measurement circuit to contactlessly receive power supply from a power source different from the secondary battery cell; and a communication circuit which transmits, via the transformer to a BMU which manages a status of a battery pack, the state of charge measured by the measurement circuit.

11 Claims, 8 Drawing Sheets

(56) References Cited

U.S. PATENT DOCUMENTS

2013/0244062 A1\* 9/2013 Teramoto ............ H01M 10/425
429/7
2014/0091769 A1 4/2014 Kim et al.

FOREIGN PATENT DOCUMENTS

| JP | 2014-211402 A | 11/2014 |
| JP | 2015-156728 A | 8/2015 |

\* cited by examiner

CELL SUPERVISING CIRCUIT AND BATTERY MANAGEMENT SYSTEM

CROSS REFERENCE TO RELATED APPLICATIONS

This is a continuation application of PCT International Application No. PCT/JP2019/033491 filed on Aug. 27, 2019, designating the United States of America, which is based on and claims priority of Japanese Patent Application No. 2018-160104 filed on Aug. 29, 2018. The entire disclosures of the above-identified applications, including the specifications, drawings and claims are incorporated herein by reference in their entirety.

FIELD

The present disclosure relates to a cell supervising circuit and a battery management system including such a cell supervising circuit.

BACKGROUND

Patent Literature (PTL) 1 discloses a battery voltage monitoring device capable of ensuring the reliability of operation by improving the redundancy of an operating power source.

CITATION LIST

Patent Literature

PTL 1: Japanese Unexamined Patent Application Publication No. 2011-163847

SUMMARY

Technical Problem

The present disclosure provides a cell supervising circuit capable of suppressing the collapse of cell balance while suppressing the addition of components related to communication, and a battery management system using such a cell supervising circuit.

Solution to Problem

A cell supervising circuit according to one aspect of the present disclosure includes: a measurement circuit which measures a state of charge of a power storage cell; an insulation element which is provided for the measurement circuit to contactlessly receive power supply from a power source different from the power storage cell; and a communication circuit which transmits, via the insulation element to a management device which manages a status of the power storage cell, information indicating the state of charge measured by the measurement circuit.

A battery management system according to another aspect of the present disclosure includes: a management device which manages a status of a power storage cell; and a cell supervising circuit, wherein the cell supervising circuit includes: a measurement circuit which measures a state of charge of the power storage cell; an insulation element which is provided for the measurement circuit to contactlessly receive power supply from a power source different from the power storage cell; and a communication circuit which transmits, to the measurement circuit via the insulation element, information indicating the state of charge measured by the measurement circuit.

Advantageous Effects

The present disclosure realizes a cell supervising circuit capable of suppressing the collapse of cell balance while suppressing the addition of components related to communication and a battery management system using such a cell supervising circuit.

BRIEF DESCRIPTION OF DRAWINGS

These and other advantages and features will become apparent from the following description thereof taken in conjunction with the accompanying Drawings, by way of non-limiting examples of embodiments disclosed herein.

DESCRIPTION OF EMBODIMENTS

Embodiment 1

[Configuration]

Figure 1:
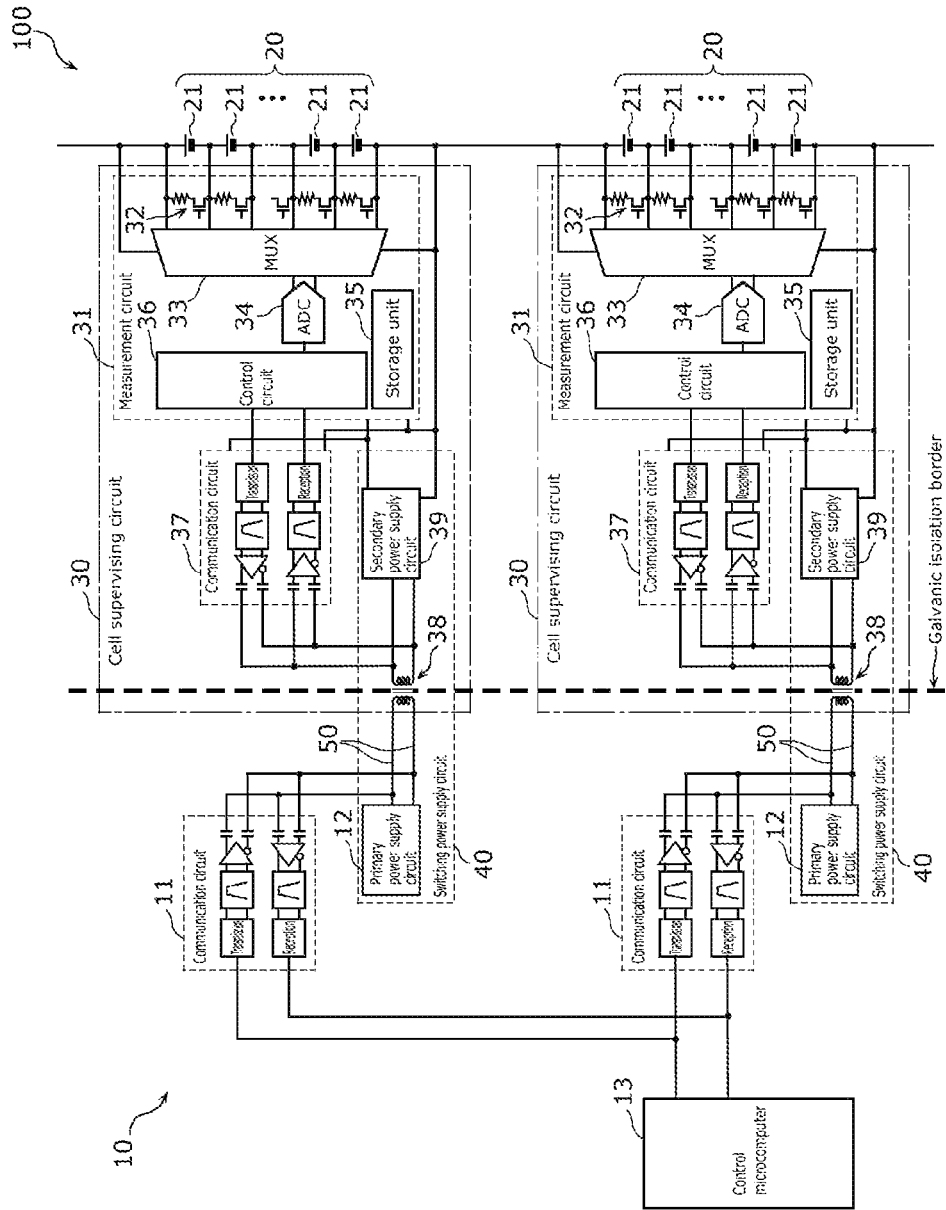
FIG. 1 is a diagram schematically illustrating a functional configuration of a BMS according to Embodiment 1.

Hereinafter, a battery management system (BMS) according to Embodiment 1 will be described. First, the configuration of the BMS according to Embodiment 1 will be described. FIG. 1 is a diagram schematically illustrating a functional configuration of the BMS according to Embodiment 1.

BMS 100 according to Embodiment 1 is loaded on, for example, a vehicle such as an electric vehicle. BMS 100 includes: battery management unit (BMU) 10; a plurality of battery packs 20; and a plurality of cell supervising circuits (CSC) 30 corresponding to the plurality of battery packs 20. FIG. 1 illustrates two battery packs 20 and two cell supervising circuit 30, but the total numbers of battery packs 20 and cell supervising circuits 30 are not limited to two, and thus the aforementioned numbers may be three or more. Moreover, BMS 100 may include one battery pack 20 and one cell supervising circuit 30.

BMU 10 monitors the state of the plurality of battery packs 20 and controls the plurality of battery packs 20. Battery pack 20 includes a plurality of secondary battery cells 21 but is only required to include at least one secondary battery cell 21. Secondary battery cell 21 is one example of a power storage cell. More specifically, secondary battery cell 21 is a lithium ion battery but may be any other battery such as a nickel hydrogen battery. The plurality of secondary battery cells 21 are, for example, serially connected but may be partially or entirely connected in parallel.

Note that it is not essential that battery pack 20 be formed by one or more secondary battery cells 21 and battery pack 20 may be formed by one or more storage capacitor cells. The storage capacitor cell is another one example of the power storage cell. More specifically, the storage capacitor cell is an electric double layer capacitor but may be, for example, a lithium ion capacitor.

More specifically, BMU 10 includes a plurality of communication circuits 11, a plurality of primary power supply circuits 12, and control microcomputer 13. FIG. 1 illustrates two communication circuits 11 and two primary power supply circuits 12, but BMU 10 is only required to include the total numbers of communication circuits 11 and primary power supply circuits 12 corresponding to the total number of cell supervising circuits 30. Note that BMU 10 is only required to include at least control microcomputer 13.

Communication circuit 11 is a circuit for BMU 10 to make communication with cell supervising circuit 30. More specifically, communication circuit 11 includes, for example, a transmission circuit, a filter, and an amplifier circuit for signal transmission; and a reception circuit, a filter, and an amplifier circuit for signal reception.

Primary power supply circuit 12 forms switching power supply circuit 40 together with transformer 38 and secondary power supply circuit 39. Switching power supply circuit 40 is a power supply circuit for performing contactless power feed to cell supervising circuit 30 through a path different from battery pack 20. That is, cell supervising circuit 30 is operated not by battery pack 20 but by an electric power supplied by switching power supply circuit 40.

Control microcomputer 13 monitors the state of the plurality of battery packs 20 and controls the plurality of battery packs 20.

The plurality of cell supervising circuits 30 are circuits respectively corresponding to the plurality of battery packs 20. Cell supervising circuit 30 is a circuit module and is formed by mounting circuit components on a substrate. More specifically, cell supervising circuit 30 includes measurement circuit 31, communication circuit 37, transformer 38, and secondary power supply circuit 39.

Measurement circuit 31 measures respective states of charge of the plurality of secondary battery cells 21 included in battery pack 20. More specifically, measurement circuit 31 measures, as parameters indicating the states of charge of secondary battery cells 21, respective voltage values of the plurality of secondary battery cells 21 included in battery pack 20. Measurement circuit 31 includes: a plurality of switching elements 32 corresponding to the plurality of secondary battery cells 21; multiplexer 33, AD converter 34, storage unit 35, and control circuit 36. Measurement circuit 31 may measure the parameters directly or indirectly indicating the states of charge.

The plurality of switching elements 32 are switched on to individually discharge the states of charge of the corresponding plurality of secondary battery cells 21 for adjustment.

Multiplexer 33 is a selection circuit which selects voltage values at both ends of the plurality of secondary battery cells 21.

AD converter 34 converts the analog voltage values selected and inputted by multiplexer 33 into digital voltage values.

Storage unit 35 is, for example, a non-volatile semiconductor memory, which stores an address for discriminating cell supervising circuit 30 from other cell supervising circuits 30 (in other words, discrimination information or recognition sign). The address can also be assumed as discrimination information for discriminating battery pack 20 from other battery packs 20. Note that, in an example of FIG. 1, storage unit 35 is illustrated as part of measurement circuit 31 (that is, included in measurement circuit 31) but may be provided as a component separate from measurement circuit 31.

Control circuit 36 generates information obtained by providing the address stored in storage unit 35 to the digital voltage value outputted from AD converter 34 (also written as information indicating the state of charge measured by measurement circuit 31), and outputs the generated information to communication circuit 37. In other words, control circuit 36 is a control logic circuit.

Communication circuit 37 transmits, via transformer 38, information indicating the states of charge measured by measurement circuit 31 to BMU 10 which manages the state of battery packs 20. More specifically, communication circuit 37 includes: for example, a transmission circuit, a filter, and an amplifier circuit for signal transmission; and a reception circuit, a filter, and an amplifier circuit for signal reception.

Transformer 38 is an insulation element for measurement circuit 31 to contactlessly receive the power supply from a power source (more specifically, a primary power supply circuit) different from battery pack 20. Transformer 38, secondary power supply circuit 39, and the primary power supply circuit form switching power supply circuit 40. Note that cell supervising circuit 30 may include another coil element instead of transformer 38 as an insulation element.

Switching power supply circuit 40 is a power supply circuit for contactlessly feeding power to cell supervising circuit 30 through a path different from battery pack 20. Measurement circuit 31 and communication circuit 37 are operated not by battery pack 20 but by the power supplied by switching power supply circuit 40. In other words, switching power supply circuit 40 is an insulated DC-DC converter.

Note that the switching frequency of switching power supply circuit 40 is, for example, approximately 350 kHz, and the frequency band of the carrier wave in communication between cell supervising circuit 30 (communication circuit 37) and BMU 10 (communication circuit 11) is higher than 350 kHz.

Effects, Etc.

In order to suppress heat generation, ignition, explosion, and deterioration caused by overcharging of battery pack 20 and maximize the state of charge of secondary battery cell 21 through charging, a typical BMS performs cell balance processing of equalizing the states of charge (SOC) of the plurality of secondary battery cells 21 included in battery pack 20 to charge the battery pack. At this point, BMU carries out daisy (bead) communication with the plurality of cell supervising circuits in order to manage the states of charge of the secondary battery cells (in other words, the voltage values of the secondary battery cells).

Typically, each of the plurality of cell supervising circuits in the typical BMS receives power supply from the battery pack (secondary battery cell) targeted for monitoring by the aforementioned cell supervising circuit. With such a configuration, a variation in the operating power of the plurality of cell supervising circuits serves as a factor contributing to the collapse of cell balance. In particular, the variation in the operating power due to a difference in the frequency of communication of the plurality of cell supervising circuits serves as a factor largely contributing to the collapse of cell balance.

There is a possible method for supplying a power from another power source (for example, a 12V battery in a case where the BMS is provided to be loaded on a vehicle) different from the battery pack to the cell supervising circuit for the purpose of suppressing the collapse of cell balance. In the method, the aforementioned another power source and the battery pack need to be galvanically isolated from each other. More specifically, the method for supplying the power from another power source to the cell supervising circuit includes, for example, power feed to the cell supervising circuit by an insulated DC-DC converter using a transformer.

However, in a case where the method for supplying the power from another power source to the cell supervising circuit is applied to the typical BMS, a power supply path (for example, a wire or a harness) needs to be provided between the plurality of cell supervising circuits and the BMU. Thus, there arise new problems such as an increase in the total number of components and a weight increase.

On the contrary, since BMS 100 also uses the power supply path (power line 50 and transformer 38) formed by switching power supply circuit 40 as a communication path of BMU 10 and cell supervising circuit 30, a power supply path does not have to be provided separately. That is, BMS 100 can suppress the increase in the total number of components, the weight increase, etc. and also can suppress the collapse of cell balance due to the variation in the operating power of cell supervising circuit 30.

[Method for Discriminating Plural Cell Supervising Circuits]

Next, the significance of the address stored in storage unit 35 will be described. In BMS 100, it is required to manage the state of charge for each secondary battery cell 21, and thus a mechanism of specifying individual secondary battery cells 21 by BMU 10 serving as a host system of cell supervising circuits 30 is required.

Here, the daisy communication is performed in the typical BMS and communication is performed in a bucket relay style in the daisy communication, so that addresses respectively specific to the plurality of cell supervising circuits 30 are sequentially provided at time of start of the communication. On the contrary, the plurality of cell supervising circuits 30 parallelly perform communication with BMU 10 in BMS 100, which therefore brings about a problem that the method for sequentially providing the addresses cannot be used.

Thus, the address specific to the cell supervising circuit 30 is stored into storage unit 35 included in aforementioned cell supervising circuit 30 in BMS 100. Cell supervising circuit 30 transmits, to BMU 10, information including the address of aforementioned cell supervising circuit 30 provided to the voltage value measured by measurement circuit 31. Consequently, BMU 10 can perform management while discriminating from which cell supervising circuit 30 the voltage value acquired through the communication has been transmitted (to which battery pack 20 the voltage value corresponds). The voltage values of the plurality of secondary battery cells 21 included in one battery pack 20 are transmitted in sequence, and thus discrimination between the plurality of secondary battery cells 21 included in one battery pack 20 is performed based on, for example, the aforementioned sequence.

Embodiment 2

[Configuration]

Figure 2:
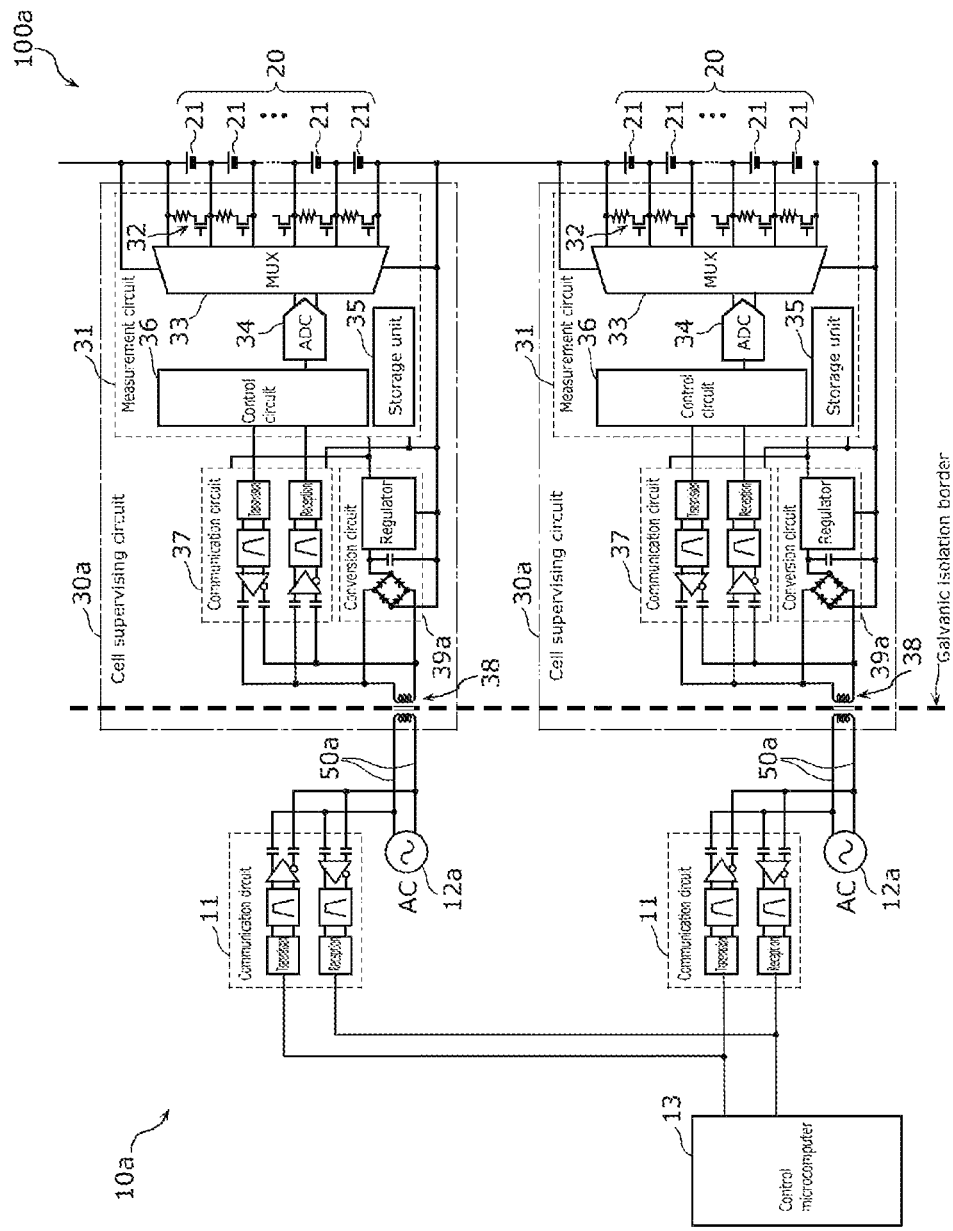
FIG. 2 is a diagram schematically illustrating a functional configuration of a BMS according to Embodiment 2.

Hereinafter, a BMS according to Embodiment 2 will be described. First, the configuration of the BMS according to Embodiment 2 will be described. FIG. 2 is a diagram schematically illustrating a functional configuration of the BMS according to Embodiment 2. Note that the description of Embodiment 2 will be provided, focusing on a difference from Embodiment 1, and the description of those already described in Embodiment 1 will be omitted or simplified as appropriate.

BMS 100*a* according to Embodiment 2 includes: BMU 10*a*; a plurality of battery packs 20; and a plurality of cell supervising circuits 30*a* corresponding to the plurality of battery packs 20.

A difference between BMU 10 and BMU 10*a* lies in that BMU 10*a* includes AC power source 12*a* instead of primary power supply circuit 12. AC power source 12*a* supplies an AC power to cell supervising circuits 30*a* via AC power line 50*a*. That is, an AC power is supplied from BMU 10*a* to cell supervising circuit 30*a* over a galvanic isolation border in BMS 100*a*.

A difference between cell supervising circuit 30 and cell supervising circuit 30*a* lies in that cell supervising circuit 30*a* includes conversion circuit 39*a* instead of secondary power supply circuit 39.

Conversion circuit 39*a* converts, into a DC power, an AC power supplied from AC power source 12*a* via transformer 38 and supplies the DC power to measurement circuit 31 and communication circuit 37. That is, transformer 38 is an insulation element for measurement circuit 31 to contactlessly receive the power supplied from AC power source 12*a* different from battery pack 20 in Embodiment 2. More specifically, conversion circuit 39*a* is formed by a full-wave rectifier circuit, a smoothening circuit, a regulator, etc. The frequency of AC power source 12*a* is, for example, 350 kHz and an effective value of AC power source 12*a* is, for example, 5V. Note that the frequency and the effective value of AC power source 12*a* are not specifically limited.

Effects and Others

In switching power supply circuit 40 described in Embodiment 1, a switching frequency and a switching pulse width fluctuate, so that a frequency component of switching noise may be spread over a wide range in some cases. That is, it may be difficult to ensure communication quality.

On the contrary, communication is performed via AC power line 50*a* to which the AC power is transmitted in BMS 100*a*. If the waveform of the AC power is a sine wave with a single frequency, the frequency component is hardly spread, which therefore provides effect of easily ensuring the communication quality. Moreover, since the frequency component is hardly spread, the degree of freedom of a frequency band where the communication is performed is also improved.

Embodiment 3

[Configuration]

Figure 3:
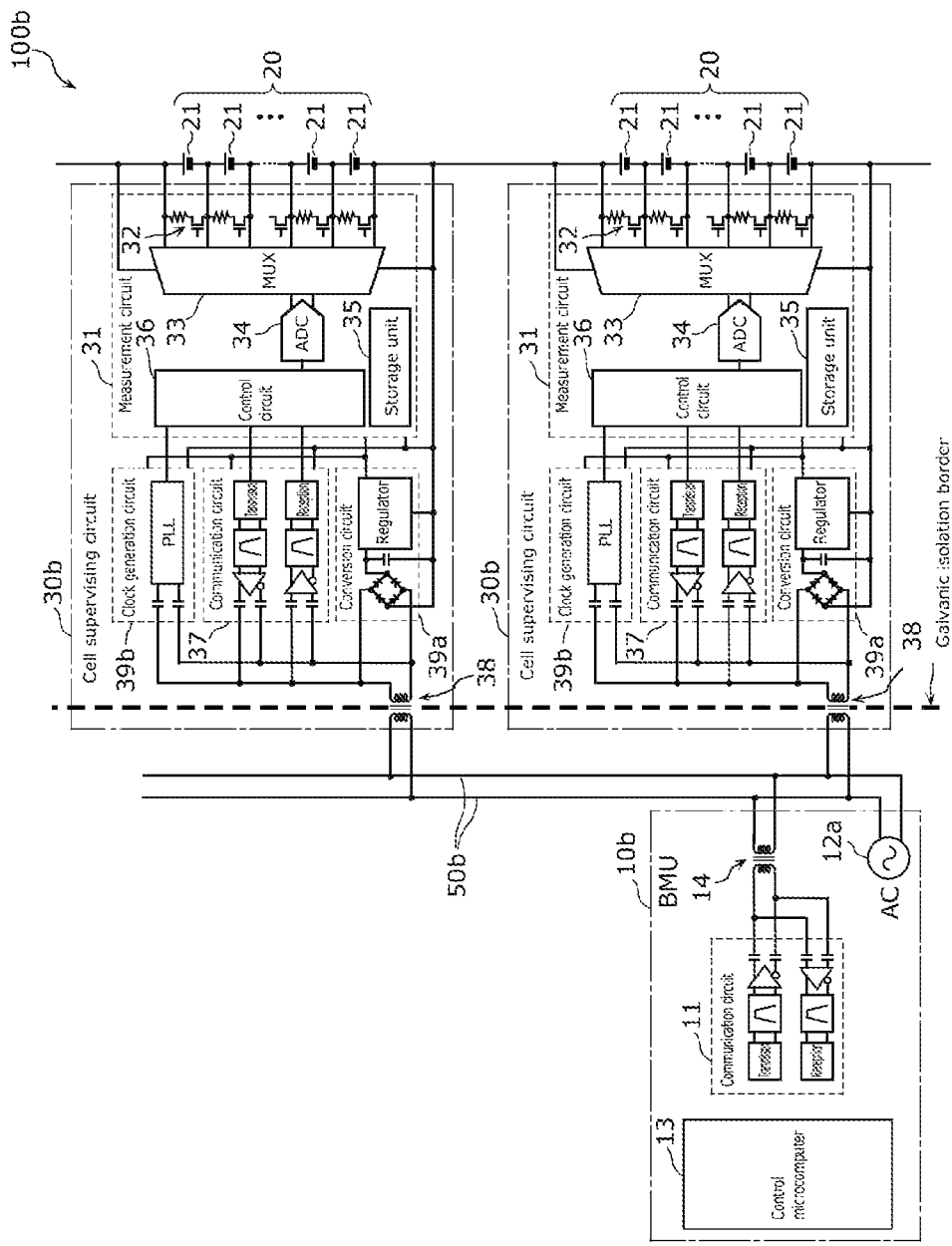
FIG. 3 is a diagram schematically illustrating a functional configuration of a BMS according to Embodiment 3.

Hereinafter, a BMS according to Embodiment 3 will be described. First, the configuration of the BMS according to Embodiment 3 will be described. FIG. 3 is a diagram schematically illustrating a functional configuration of the BMS according to Embodiment 3. Note that the description of Embodiment 3 will be provided, focusing on a difference from Embodiments 1 and 2, and the description of those already described in Embodiments 1 and 2 will be omitted or simplified as appropriate.

BMS 100b according to Embodiment 3 includes: BMU 10b; a plurality of battery packs 20; a plurality of cell supervising circuits 30b corresponding to the plurality of battery packs 20.

A difference between BMU 10a and BMU 10b lies in that BMU 10b includes one communication circuit 11 and one AC power source 12a and further includes transformer 14. Note that BMU 10b may include another coil element as an insulation element in place of transformer 14.

Communication circuit 11 of BMU 10b is connected to AC power line 50b via transformer 14. More specifically, a primary coil of transformer 14 is connected to communication circuit 11 and a secondary coil of transformer 14 is connected to AC power line 50b.

AC power line 50b is commonly used by the plurality of cell supervising circuits 30b. More specifically, each of the plurality of cell supervising circuits 30b is connected to AC power line 50b common to the plurality of cell supervising circuits 30b via transformer 38 included in aforementioned cell supervising circuit 30b. More specifically, the primary coil of transformer 38 is connected to AC power line 50b and the secondary coil of transformer 38 is connected to communication circuit 37 and conversion circuit 39a.

With such connection relation, BMU 10b can perform communication with each of the plurality of cell supervising circuits 30b via AC power line 50b. AC power line 50b is a daisy communication line.

A difference between cell supervising circuit 30a and cell supervising circuit 30b lies in that cell supervising circuit 30b includes clock generation circuit 39b.

Clock generation circuit 39b generates a clock signal synchronized with the frequency of an AC power. Measurement circuit 31 measures the voltage value of secondary battery cell 21 based on the clock signal generated. More specifically, clock generation circuit 39b is realized by a phase synchronization circuit (in other words, a phase locked loop (PLL) circuit).

Effects and Others

In BMS 100b, single AC power source 12a can be used to supply an AC power to the plurality of cell supervising circuits 30b over the galvanic isolation border. Moreover, communication can be easily performed by dedicated AC power line 50b.

Assumed as a configuration similar to that of BMS 100b is a configuration such that a power supply line (also called a bus bar) connecting together the plurality of battery packs 20 is used to perform power line communication (PLC). Such a configuration can eliminate a communication line.

Here, since the bus bar is typically a single wire without a GND wire, the use of the bus bar as a transmission line path for communication brings about a problem that noise resistance is low. Moreover, a large current intermittently flows to the bus bar, which therefore generates very large disturbance noise. Thus, there also arise a problem that it is difficult to ensure the communication quality.

However, another AC power line 50b different from the bus bar is used to perform communication in BMS 100b. More specifically, a power is supplied from AC power source 12a to the plurality of cell supervising circuits 30b over the galvanic isolation border and AC power line 50b is used to perform communication in BMS 100b. Consequently, it is possible to perform communication with high communication quality without newly providing a power supply path (more specifically, a wire, a harness, or the like) between the plurality of cell supervising circuits 30b.

[Frequency Band of Communication]

Figure 4:
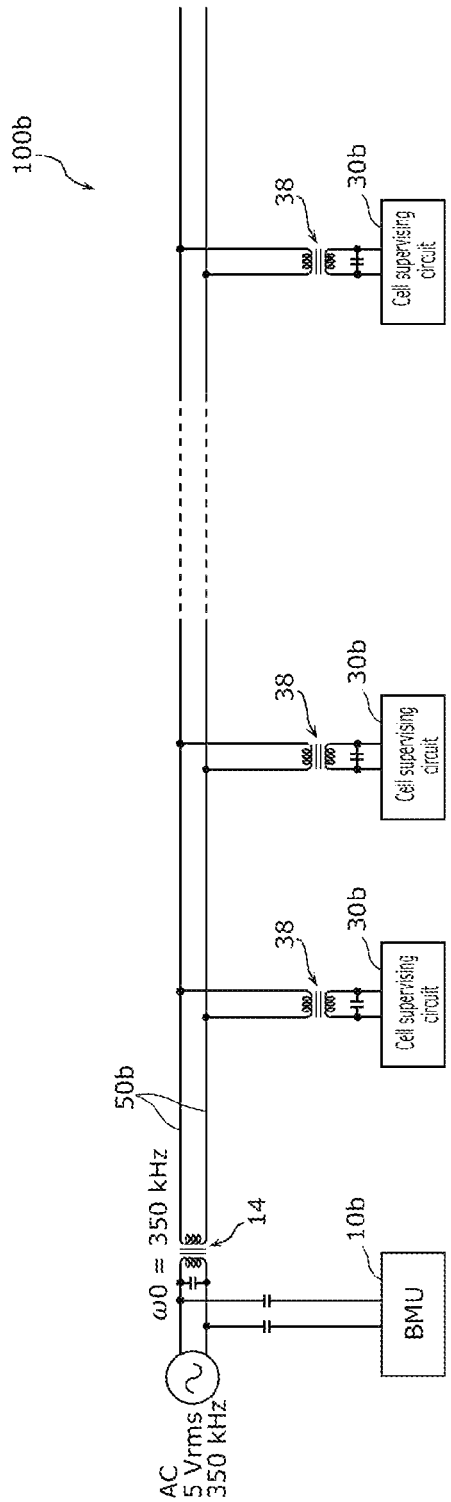
FIG. 4 is a diagram illustrating connection relation between a BMU and a plurality of cell supervising circuits in the BMS according to Embodiment 3.
Figure 5:
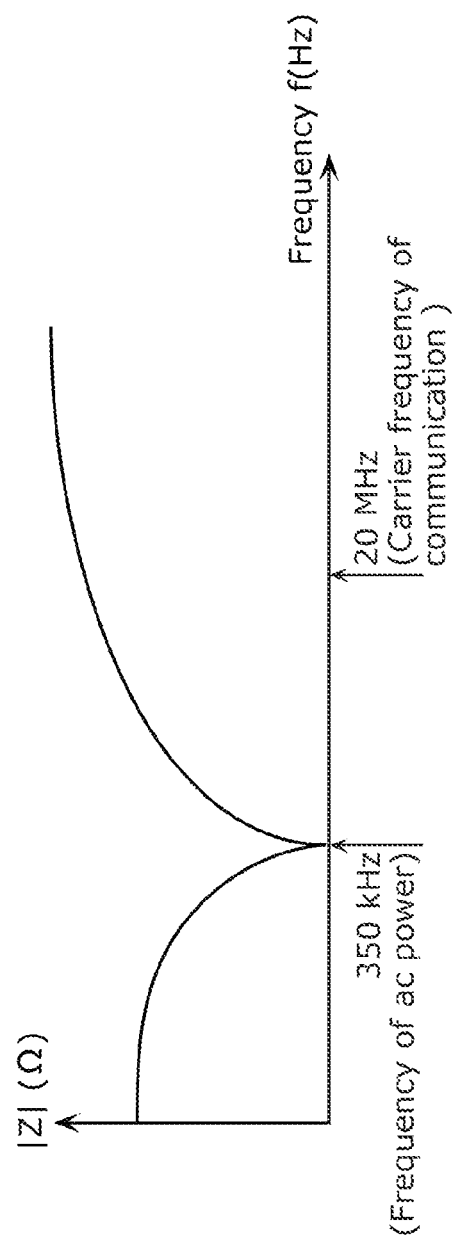
FIG. 5 is a diagram illustrating frequency characteristics of the impedance of a transmission path.

Next, the frequency band of a carrier wave of communication in BMS 100b will be described. FIG. 4 is a diagram illustrating connection relation between BMU 10b and the plurality of cell supervising circuits 30b in BMS 100b. FIG. 5 is a diagram illustrating frequency characteristics of the impedance of a transmission path including AC power line 50b.

As illustrated in FIGS. 4 and 5, the transmission path including AC power line 50b has characteristics suitable for the frequency of the AC power. More specifically, the resonance frequency of the transmission path is set to a substantially same frequency as the frequency of the AC power. The resonance frequency of the transmission path and the frequency of the AC power are, for example, several hundreds of kilohertz and 350 kilohertz in examples of FIGS. 4 and 5. Consequently, power supply with little loss is realized.

Moreover, the frequency band used in the communication is higher than the frequency of the AC power in BMS 100b. That is, communication circuit 37 of cell supervising circuit 30b performs communication by use of the frequency band higher than the frequency of the AC power. The carrier wave frequency of communication is, for example, 20 MHz.

As described above, if the carrier wave frequency of the communication is set to a high frequency band distant from the resonance frequency of AC power line 50b, BMS 100b can perform communication with a relatively low communication power by use of a frequency band in which the impedance in the impedance characteristics of the transmission path is high. Note that the way of setting such a frequency band is also applicable to Embodiments 1 and 2.

[Communication Channel]

Figure 6:
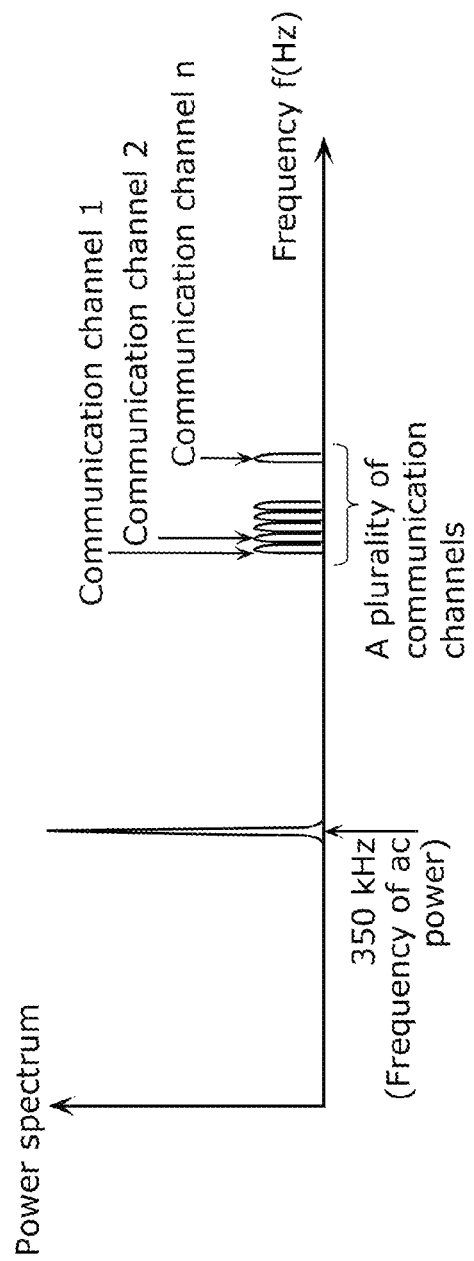
FIG. 6 is a diagram illustrating a power spectrum of the transmission path.

Moreover, the frequency band used for the communication may be divided into a plurality of frequency bands. FIG. 6 is a diagram illustrating a power spectrum of the transmission path including AC power line 50b.

As illustrated in FIG. 6, BMS 100b divides the frequency band used for the communication into a plurality of communication channels 1 to n (where n is an integer of 2 or more). Each of the plurality of cell supervising circuits 30b is used as a communication channel having part of the frequency band assigned to cell supervising circuit 30b described above. Consequently, the communication speed and the communication quality can be improved.

For example, full dual communication is realized through discrimination between a transmission channel and a reception channel. Moreover, synchronous communication between the plurality of cell supervising circuits 30b and BMU 10b is realized through communication while different communication channels are respectively assigned to the plurality of cell supervising circuits 30b. Moreover, BMS 100b can select the communication channel in the most favorable state from among the plurality of communication channels to perform the communication, and the two communication channels are used for the transmission of the same signal and signals received on a reception side are compared to each other to realize redundant communication. Note that the way of dividing such a frequency band into a plurality of communication channels is also applicable to Embodiments 1 and 2.

[Clock Generation Circuit]

Next, the significance of clock generation circuit 39b will be described. Typically, accurate calculation of the SOC and a state of health (SOH) of the battery pack requires obtaining an accurate open circuit voltage (OCV). However, it is difficult to measure the accurate OCV with a load actually set to zero in a state in which battery pack 20 is incorporated in a set.

Thus, there is a possible method for calculating the OCV through subtraction of an operating current and a voltage drop caused by the inner impedance from the measured cell voltage value by measuring the inner impedance of secondary battery cell 21. To calculate the accurate OCV by the aforementioned method, the timing of measuring the voltages of the plurality of secondary battery cells 21 and the timing of measuring the current need to be brought into agreement with each other with high accuracy.

Moreover, the current measurement is typically performed on a BMU side, targeted on one portion of the bus bar, and each of the plurality of cell supervising circuits includes an individual clock oscillator and the plurality of cell supervising circuits independently operate without synchronizing with each other. In such a case, the timing of measuring the voltage is instructed from the BMU side through daisy communication, but it is impossible to accurately synchronize the timing of measuring the voltages and the timing of measuring the current with each other due to a delay in the communication time and a variation of clock generators of the plurality of cell supervising circuits.

On the contrary, an AC power is supplied from single AC power source 12a to the plurality of cell supervising circuits 30b in BMS 100b. Therefore, generating a clock signal based on the frequency of the AC power by clock generation circuit 39b makes it possible to synchronize respective system clocks of the plurality of cell supervising circuits 30b. Further, synchronizing the current measurement timing on BMU 10b side with the frequency of the AC power makes it possible to accurately synchronize the timing of measuring the voltage of secondary battery cell 21 by cell supervising circuit 30b and the timing of measuring the current on BMU 10b side.

Thus, BMS 100b can accurately measure the inner impedance of secondary battery cell 21 to thereby calculate the accurate OCV and more accurately calculate the SOC and the SOH.

[Variation]

Figure 7:
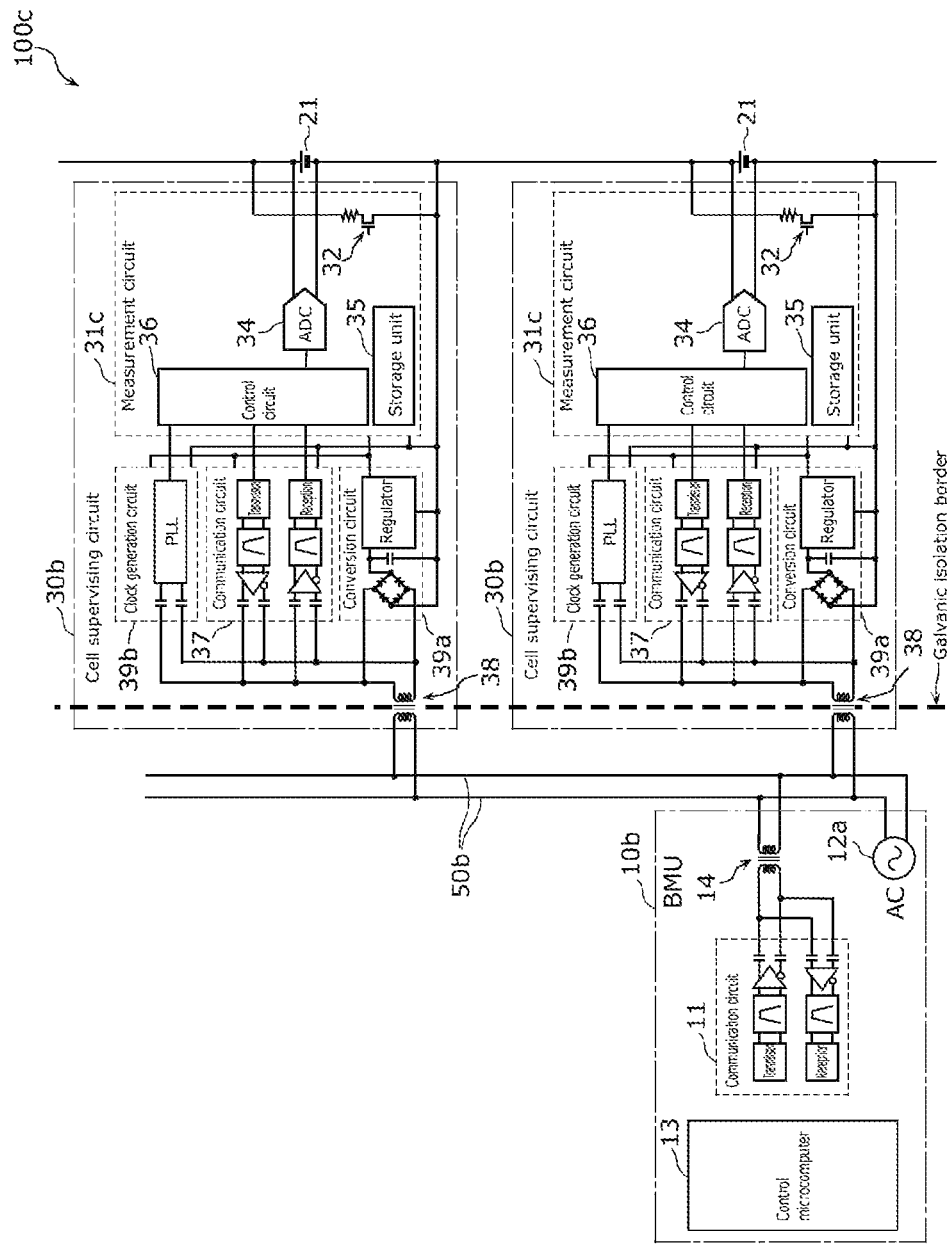
FIG. 7 is a diagram schematically illustrating a functional configuration of a BMS according to a variation of Embodiment 3.

Cell supervising circuit 30b may target on only one secondary battery cell 21 for monitoring. FIG. 7 is a diagram schematically illustrating a functional configuration of a BMS (BMS according to the variation of Embodiment 3) in which cell supervising circuit 30b targets on only one secondary battery cell 21 for the monitoring. Measurement circuit 31c does not include multiplexer 33 in BMS 100c illustrated in FIG. 7. That is, it is possible to omit multiplexer 33 in BMS 100c. Note that cell supervising circuit 30 or cell supervising circuit 30a may target on only one secondary battery cell 21 for monitoring in Embodiments 1 and 2.

Embodiment 4

Figure 8:
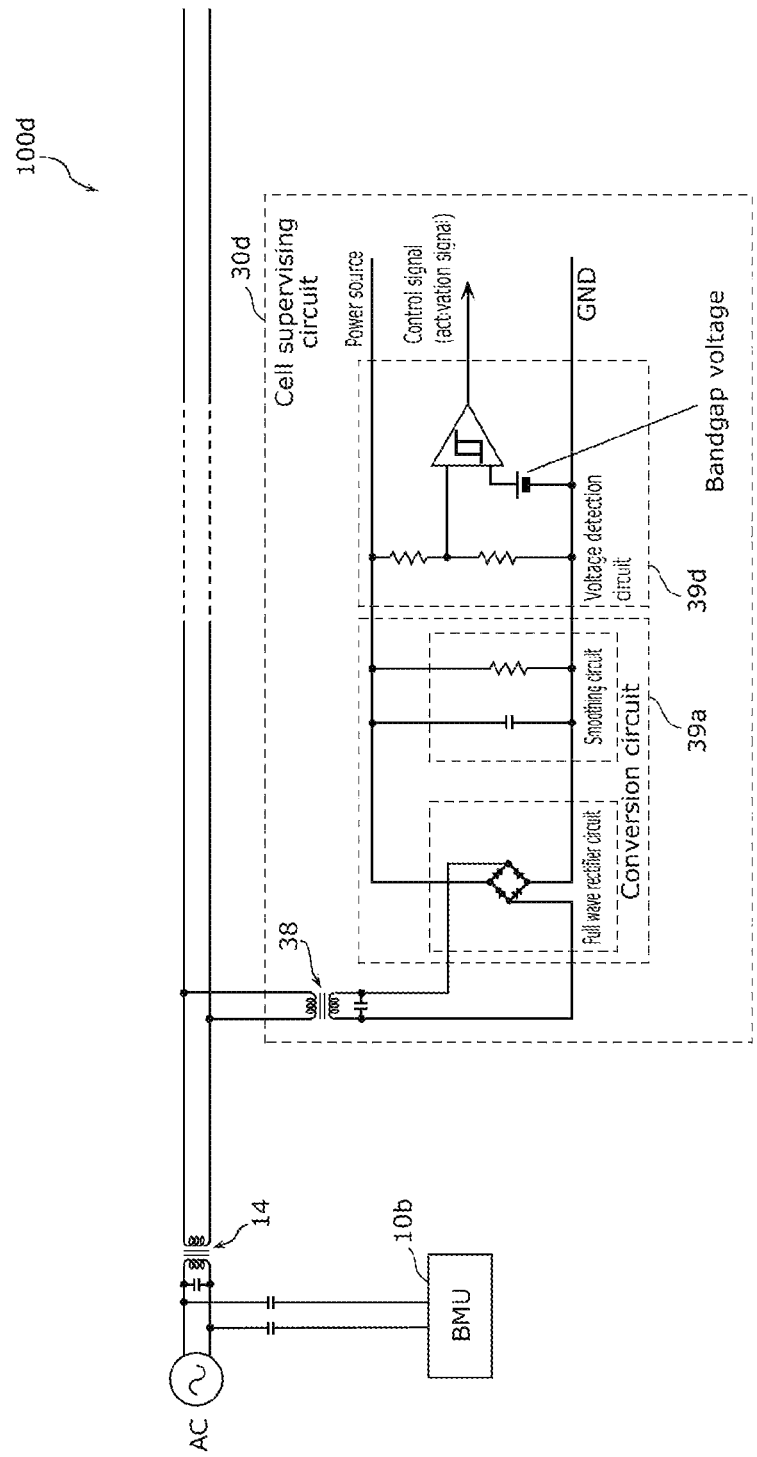
FIG. 8 is a diagram schematically illustrating a functional configuration of a BMS according to Embodiment 4.

Hereinafter, a BMS according to Embodiment 4 will be described. First, a configuration of the BMS according to Embodiment 4 will be described. FIG. 8 is a diagram schematically illustrating a functional configuration of the BMS according to Embodiment 4. Note that the description of Embodiment 4 will be provided, focusing on a difference from Embodiments 1 to 3, and those already described in Embodiments 1 to 3 will be omitted or simplified as appropriate.

BMS 100d according to Embodiment 3 includes: BMU 10b; a plurality of battery packs 20 (not illustrated in FIG. 8); and a plurality of cell supervising circuits 30d corresponding to the plurality of battery packs 20.

Cell supervising circuit 30d includes voltage detection circuit 39d at a later stage of conversion circuit 39a. Although not illustrated, other configurations of cell supervising circuit 30d are the same as those of cell supervising circuit 30b.

Voltage detection circuit 39d outputs a control signal for controlling the activation or stop of measurement circuit 31 in accordance with an output voltage of conversion circuit 39a. More specifically, voltage detection circuit 39d is realized by, for example, a comparator circuit, and outputs a control signal (at a high level) when the output voltage of conversion circuit 39a is greater than or equal to a predetermined voltage. Voltage detection circuit 39d stops a control signal (at a low level) when the output voltage of conversion circuit 39a is less than the predetermined voltage. Note that the logic of the control signal may be reverse, and voltage detection circuit 39d may output the control signal (at a high level) when the output voltage of conversion circuit 39a is less than the predetermined voltage and may stop the control signal (at a low level) when the output voltage of conversion circuit 39a is greater than or equal to the predetermined voltage.

As described above, conversion circuit 39a converts the AC power provided from AC power source 12a into a DC power, and thus voltage detection circuit 39d can be said to output a control signal upon start of the supply of the AC power from AC power source 12a to cell supervising circuit 30d. The control signal is, for example, a signal for controlling the activation or stop of cell supervising circuit 30d (for example, a power on reset signal), and more specifically is outputted to control circuit 36.

Typically, when battery pack 20 is not in use, the cell supervising circuit needs to be shut down to suppress the power consumption of battery pack 20 at a maximum. For example, in a case where the BMS is loaded on an electric car, even when a state in which the electric car is stopped is maintained for approximately one to two years without performing the charging of battery pack 20, it is necessary that battery pack 20 do not turn into a completely discharged state (the electric car needs to be operable).

In order to shut down the cell supervising circuit, the cell supervising circuit (more specifically, a battery management IC corresponding to the cell supervising circuit, in other words, a battery monitoring IC) has a shutdown mode, but a method for activating the cell supervising circuit in the shutdown mode is still to be reviewed. The BMU uses a power supply system different from a high voltage system of, for example, battery pack 20, and thus the reference voltage differs from that of the cell supervising circuit and an activation signal needs to be provided to the cell supervising circuit over the galvanic isolation border in order to activate the cell supervising circuit by the BMU.

Possible methods for providing the activation signal to the cell supervising circuit include: for example, a method using a photocoupler; and a method for transmitting an activation signal through a daisy communication interface. The method using the photocoupler faces a problem that a wire or a harness for connection between the plurality of cell supervising circuits and the BMU is required. Moreover, the method for transmitting the activation signal through the daisy communication interface faces a problem that a reception circuit cannot be turned off in order to permit cell supervising circuit 30d to receive the activation signal even in the shutdown mode, which requires slight power consumption in the shutdown mode.

On the contrary, BMU 10b can control the turning off and on of the control signal (that is, the activation signal) provided from voltage detection circuit 39d to measurement circuit 31 as a result of turning on and off of AC power source 12a in BMS 100d. That is, installing voltage detection circuit 39d which detects the AC power on cell supervising circuit 30d side makes it possible for BMU 10b to easily activate cell supervising circuit 30d.

More specifically, note that conversion circuit 39a which converts the AC power into a DC power can be formed by a diode bridge and a smoothening capacitor, so that a circuit current is no longer required. Moreover, since voltage detection circuit 39c operates based on the DC power source provided by rectifying the AC power, power supply from battery pack 20 side does not have to be received. Therefore, with the configuration like that of cell supervising circuit 30d, it is possible to set, to almost zero, the power supplied from battery pack 20 and consumed by cell supervising circuit 30d in the shutdown mode.

SUMMARY

As described above, cell supervising circuit 30 includes: measurement circuit 31 which measures a state of charge of secondary battery cell 21; transformer 38 for measurement circuit 31 to contactlessly receive power supply from a power source different from secondary battery cell 21; and communication circuit 37 which transmits, via transformer 38 to BMU 10 which manages the state of secondary battery cell 21, information indicating the state of charge measured by measurement circuit 31. Secondary battery cell 21 is one example of a power storage cell and transformer 38 is one example of an insulation element. BMU 10 is one example of a management device. Note that cell supervising circuits 30a, 30b, and 30d also have the same configuration.

Such cell supervising circuit 30 uses, as a communication path formed with BMU 10, a power supply path from a power source different from a power source of secondary battery cell 21, and thus it is possible to suppress the collapse of cell balance due to variation in the operating power of cell supervising circuit 30 while suppressing the addition of components related to communication.

Moreover, for example, in BMS 100b, the aforementioned power source is AC power source 12a and cell supervising circuit 30b further includes conversion circuit 39a which converts, into a DC power, the AC power supplied from AC power source 12a via transformer 38 and supplies the DC power to measurement circuit 31.

Such cell supervising circuit 30b can covert the AC power into a DC power for operation.

Moreover, for example, transformer 38 is connected to AC power source 12a via AC power line 50b in BMS 100b. AC power line 50b is connected with another cell supervising circuit 30b different from aforementioned cell supervising circuit 30b and BMS 100b.

Such cell supervising circuit 30b can use AC power line 50b common to another cell supervising circuit 30b to perform communication with BMU 10.

Moreover, for example, communication circuit 37 uses a frequency band higher than the frequency of the AC power to perform communication in BMS 100b.

Such cell supervising circuit 30b can use a frequency band higher than the impedance in the impedance characteristics of the transmission path to perform communication with a relatively low communication power.

Moreover, for example, communication circuit 37 uses part of the frequency band as a communication channel assigned to cell supervising circuit 30b in BMS 100b.

Such cell supervising circuit 30b can utilize the communication channel to thereby improve the communication speed and the communication quality.

Moreover, for example, cell supervising circuit 30d further includes voltage detection circuit 39d which outputs a control signal for controlling the activation or stop of measurement circuit 31 in accordance with the output voltage of conversion circuit 39a.

With such cell supervising circuit 30d, BMU 10b can easily activate cell supervising circuit 30d.

Moreover, for example, cell supervising circuit 30b further includes clock generation circuit 39b which generates a clock signal synchronized with the frequency of the AC power. Measurement circuit 31 measures the state of charge of secondary battery cell 21 based on the clock signal generated.

Consequently, for example, when the AC power is supplied from single AC power source 12a to the plurality of cell supervising circuits 30b, the AC power can be used to synchronize respective system clocks of the plurality of cell supervising circuits 30b.

Moreover, for example, cell supervising circuit 30b further includes storage unit 35 which stores an address for discriminating cell supervising circuit 30b from another cell supervising circuit 30b. The address is one example of discrimination information.

With such cell supervising circuit 30b, the transmission of the state of charge provided with the address of cell supervising circuit 30b makes it possible for BMU 10b to discriminate which cell supervising circuit 30b has transmitted the state of charge acquired through the communication for the purpose of management.

Moreover, BMS 100 includes: BMU 10 which manages the state of secondary battery cell 21; and cell supervising circuit 30. Cell supervising circuit 30 includes: measurement circuit 31 which measures the state of charge of secondary battery cell 21; transformer 38 which is provided for measurement circuit 31 to contactlessly receive the power supply from a power source different from secondary battery cell 21; and communication circuit 37 which transmits, to BMU 10 via transformer 38, information indicating the state of charge measured by the measurement circuit.

Such BMS 100 uses, as the communication path of BMU 10 and cell supervising circuit 30, a power supply path from another power source different from secondary battery cell 21. Thus, BMS 100 can suppress the collapse of cell balance due to the variation in the operating power of cell supervising circuit 30 while suppressing the addition of components related to the communication.

Moreover, for example, BMS 100b includes a plurality of cell supervising circuits 30b corresponding to the plurality of secondary battery cells 21. Each of the plurality of cell supervising circuits 30b is connected to AC power line 50b common to the plurality of cell supervising circuits 30b via transformer 38 included in aforementioned cell supervising circuit 30. BMU 10b performs communication with each of the plurality of cell supervising circuits 30b via AC power line 50b.

In such BMS 100b, BMU 10b can perform communication with each of the plurality of cell supervising circuits 30b by use of AC power line 50b common to the plurality of cell supervising circuits 30b.

Moreover, for example, BMU 10b performs communication by use of a frequency band higher than the frequency of the AC power through AC power line 50*b* in BMS 100*b*. Each of the plurality of cell supervising circuits 30*b* uses part of the frequency band as the communication channel assigned to aforementioned cell supervising circuit 30*b*.

Such BMS 100*b* can utilize the communication channel to thereby improve the communication speed and the communication quality.

Moreover, for example, in BMS 100*b*, each of the plurality of cell supervising circuits 30*b* further includes storage unit 35 which stores the address for discriminating another cell supervising circuit 30*b* different from aforementioned cell supervising circuit 30*b*. The information having the address of aforementioned cell supervising circuit 30*b* provided to the measured state of charge is transmitted to BMU 10*b*.

In such BMS 100*b*, the transmission of the information provided with the address of cell supervising circuit 30*b* by cell supervising circuit 30*b* permits BMU 10*b* to perform management while discriminate which cell supervising circuit 30*b* has transmitted the state of charge acquired through the communication.

Other Embodiments

The embodiments have been described above, but the present disclosure is not limited to the embodiments described above.

For example, the embodiments described above illustrate the transformer as the insulation element, but the insulation element may be another insulation element such as an electromagnetic resonance coupler.

Moreover, the battery pack used in an electric car is subjected to the management in the embodiments described above, but the BMS may manage a battery provided for any purpose.

Moreover, the circuit configurations described in the embodiments above are each one example and the present disclosure is not limited to the aforementioned circuit configurations. That is, the present disclosure also includes a circuit which can, similarly to the aforementioned circuit configuration, realize the characteristic functions of the present disclosure. For example, the present disclosure also includes those in which elements such as a switching element (transistor), a resistive element, and a capacitive element are connected in series or in parallel to a certain element within a range in which same functions as those of the aforementioned circuit configurations can be realized.

Moreover, the components included in the cell supervising circuit may be integrated in any manner in the embodiments described above. For example, the measurement circuit and the communication circuit may be realized as a single integrated circuit or may be realized as mutually different integrated circuits.

Moreover, the cell supervising circuit is realized by hardware in the embodiments described above. However, part of the components included in the cell supervising circuit may be realized by executing a software program suitable for the aforementioned components. Part of the components included in the cell supervising circuit may be realized by reading and executing a software program recorded on a recording medium such as a hard disc or a semiconductor memory by a program execution unit such as a central processing unit (CPU) or a processor.

Moreover, the processing executed by the specific processor in the embodiments described above may be executed by another processor. Moreover, the sequence of a plurality of processes may be changed or the plurality of processes may be performed in parallel in the operation described in the embodiments above.

In addition, the present disclosure also includes a mode obtained by making various modifications conceivable to those skilled in the art to the embodiments or a mode realized by combining the components and the functions in the embodiments in a desired manner within a scope not departing from the spirits of the present disclosure.

For example, the present disclosure may be released as a BMU, a power storage capacitor management system, or a power storage capacitor management unit, or the like. The present disclosure may be realized as a vehicle such as an electric car on which the cell supervising circuit or the BMS according to any of the embodiments described above is loaded. The present disclosure may be realized as a device other than a vehicle on which the cell supervising circuit or the BMS according to any of the embodiments described above is loaded.

Although only some exemplary embodiments of the present disclosure have been described in detail above, those skilled in the art will readily appreciate that many modifications are possible in the exemplary embodiments without materially departing from the novel teachings and advantages of the present disclosure. Accordingly, all such modifications are intended to be included within the scope of the present disclosure.

INDUSTRIAL APPLICABILITY

The cell supervising circuit and the BMS using such a cell supervising circuit of the present disclosure are widely usable for in-vehicle uses, etc.

The invention claimed is:

1. A cell supervising circuit, comprising:
   a measurement circuit which measures a state of charge of a power storage cell;
   an insulation element which is provided for the measurement circuit to contactlessly receive power supply from an alternating current (AC) power source different from the power storage cell via a power supply path;
   a communication circuit which transmits, via the insulation element to a management device which manages a status of the power storage cell, information indicating the state of charge measured by the measurement circuit; and
   a conversion circuit that converts AC power supplied from the AC power source into direct current (DC) power,
   a primary side of the insulation element is connected to the AC power source via an AC power line,
   a secondary side of the insulation element is connected to the communication circuit and the conversion circuit,
   the AC power line is connected with the management device and another cell supervising circuit different from the cell supervising circuit, and
   when the AC power is being supplied from the AC power source to the cell supervising circuit, the communication circuit performs communication with a control microcomputer included in the management device by use of a frequency band higher than a frequency of the AC power.

2. The cell supervising circuit according to claim 1,
   wherein the power source is an alternating current (AC) power source, and
   the cell supervising circuit further comprises a conversion circuit which converts, into a direct current (DC)

power, an AC power supplied from the power source via the insulation element and supplies the DC power to the measurement circuit.

3. The cell supervising circuit according to claim 2, wherein the insulation element is connected to the power source via an AC power line, and
the AC power line is connected with another cell supervising circuit different from the cell supervising circuit and the management device.

4. The cell supervising circuit according to claim 1, wherein the communication circuit uses part of the frequency band as a communication channel allocated to the cell supervising circuit.

5. The cell supervising circuit according to claim 2, further comprising:
a voltage detection circuit which outputs a control signal for controlling activation or stop of the measurement circuit in accordance with an output voltage of the conversion circuit.

6. The cell supervising circuit according to claim 2, further comprising:
a clock generation circuit which generates a clock signal synchronized with the frequency of the AC power,
wherein the measurement circuit measures the state of charge of the power storage cell based on the clock signal generated.

7. The cell supervising circuit according to claim 1, further comprising: a storage unit which stores discrimination information for discriminating the cell supervising circuit from another cell supervising circuit.

8. A battery management system, comprising:
a management device which manages a status of a power storage cell; and
a cell supervising circuit,
wherein the cell supervising circuit includes:
a measurement circuit which measures a state of charge of the power storage cell;
an insulation element which is provided for the measurement circuit to contactlessly receive power supply from an alternating current (AC) power source different from the power storage cell via a power supply path; and
a communication circuit which transmits, to a management device via the insulation element, information indicating the state of charge measured by the measurement circuit; and
a conversion circuit that converts AC power supplied from the AC power source into direct current (DC) power,
a primary side of the insulation element is connected to the AC power source via an AC power line,
a secondary side of the insulation element is connected to the communication circuit and the conversion circuit,
the AC power line is connected with the management device and another cell supervising circuit different from the cell supervising circuit, and
when the AC power is being supplied from the AC power source to the cell supervising circuit, the communication circuit performs communication with a control microcomputer included in the management device by use of a frequency band higher than a frequency of the AC power.

9. The battery management system according to claim 8, further comprising:
a plurality of cell supervising circuits each of which is the cell supervising circuit, the plurality of cell supervising circuits being provided for a plurality of power storage cells which includes the power storage cell,
wherein each of the plurality of cell supervising circuits is connected to an AC power line common to the plurality of cell supervising circuits via the insulation element included in the cell supervising circuit, and
the management device performs communication with each of the plurality of cell supervising circuits via the AC power line.

10. The battery management system according to claim 9, wherein each of the plurality of cell supervising circuits uses part of the frequency band as a communication channel assigned to the cell supervising circuit.

11. The battery management system according to claim 9, wherein each of the plurality of cell supervising circuits:
further includes a storage unit which stores discrimination information for discriminating the cell supervising circuit from rest of the plurality of cell supervising circuits other than the cell supervising circuit; and
transmits, to the management device, the information including the discrimination information of the cell supervising circuit provided to the state of charge measured.

* * * * *